(12) United States Patent
Shim

(10) Patent No.: US 8,110,850 B2
(45) Date of Patent: Feb. 7, 2012

(54) SEMICONDUCTOR LIGHT EMITTING DEVICE

(75) Inventor: Sang Kyun Shim, Jeonju-si (KR)

(73) Assignee: LG Innotek Co., Ltd, Seoul (KR)

( * ) Notice: Subject to any disclaimer, the term of this patent is extended or adjusted under 35 U.S.C. 154(b) by 61 days.

(21) Appl. No.: 12/647,252

(22) Filed: Dec. 24, 2009

(65) Prior Publication Data

US 2010/0163903 A1   Jul. 1, 2010

(30) Foreign Application Priority Data

Dec. 26, 2008   (KR) .................. 10-2008-0134303

(51) Int. Cl.
  *H01L 33/00* (2010.01)
(52) U.S. Cl. ................. 257/103; 257/E33.074
(58) Field of Classification Search .............. 257/98, 257/103, E33.074, E33.023, E33.072, E33.005, 257/E33.006
See application file for complete search history.

(56) References Cited

U.S. PATENT DOCUMENTS

| | | |
|---|---|---|
| 2005/0093008 A1 | 5/2005 | Suehiro et al. |
| 2006/0273336 A1 | 12/2006 | Fujikura et al. |
| 2007/0018186 A1 | 1/2007 | Shin et al. |
| 2008/0008964 A1* | 1/2008 | Chan et al. .............. 430/270.13 |
| 2008/0061308 A1* | 3/2008 | Yoon ............................ 257/94 |
| 2008/0290346 A1 | 11/2008 | Shim |
| 2008/0296598 A1 | 12/2008 | Wang et al. |

FOREIGN PATENT DOCUMENTS

| | | |
|---|---|---|
| JP | 2005-244201 A | 9/2005 |
| JP | 2007-266356 A | 10/2007 |
| KR | 10-0618288 B1 | 8/2006 |
| KR | 10-2007-001104 A | 1/2007 |
| KR | 10-0862516 B1 | 10/2008 |

\* cited by examiner

*Primary Examiner* — Thomas L Dickey
*Assistant Examiner* — Fazli Erdem
(74) *Attorney, Agent, or Firm* — Birch, Stewart, Kolasch & Birch, LLP

(57) ABSTRACT

A semiconductor light emitting device is provided. The semiconductor light emitting device comprises a plurality of compound semiconductor layers including a first conductive semiconductor layer, an active layer and a second conductive semiconductor layer, and a layer of the plurality of compound semiconductor layers comprising a roughness comprising a sapphire material.

9 Claims, 6 Drawing Sheets

SEMICONDUCTOR LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2008-0134303 (filed on Dec. 26, 2008), which is hereby incorporated by reference in its entirety.

BACKGROUND

The present disclosure relates to a semiconductor light emitting device.

III-V group nitride semiconductors have been variously applied as optical devices that include blue/green light emitting diodes (LED), high-speed switching devices such as a metal semiconductor field effect transistors (MOSFET), and hetero junction field effect transistors (HEMT), and as light sources for lighting and display apparatuses, etc. In particular, a light emitting device using a III group nitride semiconductor can implement highly-efficient light emission, having a direct transition-type band gap that correspond to the region from visible rays to ultraviolet rays.

Nitride semiconductors have been mainly used as light emitting diodes (LED) and laser diodes (LD), and studies for improving manufacturing processes and optical efficiency continue.

SUMMARY

Embodiments provide a semiconductor light emitting device comprising a roughness of a sapphire ($Al_2O_3$) material on a conductive semiconductor layer.

Embodiments provide a semiconductor light emitting device comprising a roughness of a sapphire ($Al_2O_3$) material on a transparent electrode layer.

An embodiment provides a semiconductor light emitting device comprising: a plurality of compound semiconductor layers including a first conductive semiconductor layer, an active layer and a second conductive semiconductor layer; and a layer of the plurality of compound semiconductor layers comprising a roughness comprising a sapphire material.

An embodiment provides a semiconductor light emitting device comprising: a substrate; a plurality of compound semiconductor layers on the substrate, wherein the plurality of compound semiconductor layers comprises a first conductive semiconductor layer, an active layer on the first conductive semiconductor layer, and a second conductive semiconductor layer on the active layer; a first electrode electrically connected to the first conductive semiconductor layer; a second electrode electrically connected to the second conductive semiconductor layer; and a first roughness comprising a sapphire material on the second conductive semiconductor layer.

An embodiment provides a semiconductor light emitting device comprising: a first conductive semiconductor layer; a first electrode on the first conductive semiconductor layer; an active layer under the first conductive semiconductor layer; a second conductive semiconductor layer under the active layer; a second electrode layer under a second conductive semiconductor; and a first roughness comprising a sapphire material between second electrode layer and the second conductive semiconductor.

The details of one or more embodiments are set forth in the accompanying drawings and the description below. Other features will be apparent from the description and drawings, and from the claims.

DETAILED DESCRIPTION OF THE EMBODIMENTS

Figure 1:
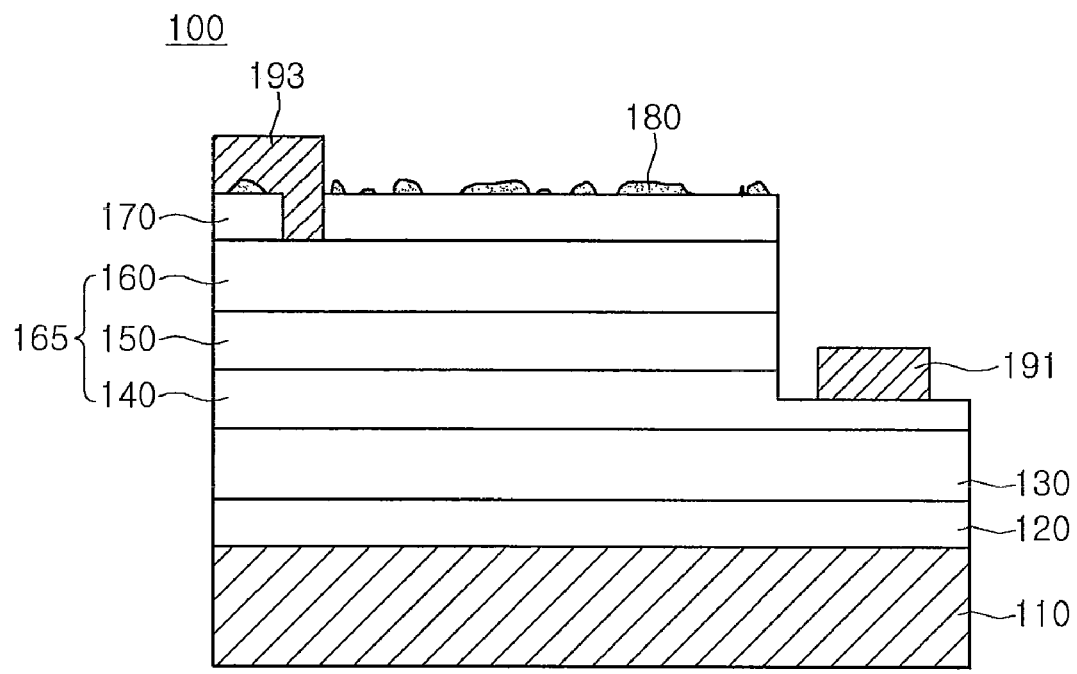
FIG. 1 is a side sectional view illustrating a semiconductor light emitting device according to a first embodiment.

Reference will now be made in detail to the embodiments of the present disclosure, examples of which are illustrated in the accompanying drawings.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings. Also, the thickness of each layer in the drawings is an example, and is not limited thereto. Technical features of each embodiment are not limited to that embodiment and may be selectively applied to other embodiments.

FIG. 1 is a side sectional view illustrating a semiconductor light emitting device according to a first embodiment.

Referring to FIG. 1, a semiconductor light emitting device 100 includes a substrate 110, a buffer layer 120, an undoped semiconductor layer 130, a first conductive semiconductor layer 140, an active layer 150, a second conductive semiconductor layer 160, a transparent electrode layer 170, and a roughness 180.

The semiconductor light emitting device 100 includes a Light Emitting Diode (LED) including a plurality of compound semiconductor layers of, for example, group III-V elements. LED may be a UV LED, or a colored LED emitting blue, green, or red light. The emitted light of LED may be implemented in various semiconductors within the technical scope of the embodiment.

The substrate 110 may be formed of at least one of sapphire ($Al_2O_3$), SiC, Si, GaAs, GaN, ZnO, GaP, InP, and Ge. The substrate 110 may be a substrate having conductive or insulating characteristics. A roughness pattern may be formed on/under the substrate 110. The roughness pattern may have any one of a striated, lens-shaped, columnar, and horned configuration.

The buffer layer 120 is disposed on the substrate 110. The buffer layer 120 may reduce the lattice mismatch between a GaN material and a substrate material, and may be formed of at least one of GaN, InN, AlN, InGaN, AlGaN, InAlGaN, and AlInN. Another buffer layer including a compound semiconductor layer (for example, ZnO) of group II to VI elements may be formed on the substrate 110 in a layer- or multiple pattern, but is not limited thereto.

An undoped semiconductor layer 130 is disposed on the buffer layer 120. The undoped semiconductor layer 130 may be formed of an undoped GaN-based semiconductor not including a first conductive dopant or a second conductor dopant. The buffer layer 120 and/or the undoped semiconductor layer 130 may not be formed, or are removed and excluded from the final device.

A light emitting structure 165 including a plurality of compound semiconductor layers may be disposed on the buffer layer 120 and/or the undoped semiconductor layer 130. The light emitting structure 165 includes a stacked structure of a first conductive semiconductor layer 140, an active layer 150, and a second conductive semiconductor layer 160 using a compound semiconductor of group III-V elements.

The first conductive semiconductor layer 140 may be selected from compound semiconductors of group III-V elements (for example, GaN, AlN, AlGaN, InGaN, InN, InAlGaN, AlInN, AlGaAs, GaP, GaAs, GaAsP, and AlGaInP) doped with a first conductive dopant. When the first conductive semiconductor is an N-type semiconductor, the first conductive dopant includes an N-type dopant such as Si, Ge, Sn, Se, and Te. The first conductive semiconductor layer 140 may be formed in a mono- or multi-layer, but is not limited thereto.

The active layer 150 is formed on the first conductive semiconductor layer 140 in a single or multiple quantum well structure. The active layer 150 may include, for example, a cycle of InGaN well layer/GaN barrier layer repeatedly stacked using a compound semiconductor material of group III-V elements. A conductive clad layer may be disposed on and/or under the active layer 150. The conductive clad layer may be formed of an AlGaN-based semiconductor.

The second conductive semiconductor layer 160 is disposed on the active layer 150. The second conductive semiconductor layer 160 may be selected from the compound semiconductors of group III-V elements doped with a second conductive dopant, which may include, for example, GaN, AlN, AlGaN, InGaN, InN, InAlGaN, AlInN, AlGaAs, GaP, GaAs, GaAsP and AlGaInP. When the second conductive semiconductor is a P-type semiconductor, the second conductive dopant includes a P-type dopant such as Mg, Zn, Ca, Sr, and Ba. The second conductive semiconductor layer 160 may be formed in a mono- or multi-layer, but is not limited thereto.

The light emitting structure 165 may include a third conductive semiconductor layer (not shown), that is, an N-type semiconductor layer or a P-type semiconductor layer on the second conductive semiconductor layer 160. Also, the first conductive semiconductor layer 140 may be implemented in a P-type semiconductor layer, and the second conductive semiconductor layer 160 may be implemented in an N-type semiconductor layer. Thus, the light emitting structure 165 may include at least one of an N—P junction, a P—N junction, an N—P—N junction, and a P—N—P junction structure.

A transparent electrode layer 170 may be disposed on the second conductive semiconductor layer 160 or the third conductive semiconductor layer. The transparent electrode layer 170 may be selected from materials of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), ZnO, $IrO_x$, $RuO_x$, NiO, Ni/Au, IrOx, RuOx, RuOx/ITO, Ni/IrOx/Au, Ni/IrOx/Au/ITO and other metal oxides.

An ohmic contact layer (not shown) may be disposed on the second conductive semiconductor layer 160 in a layer or multiple pattern. The ohmic contact layer may be formed of any of the materials forming the transparent electrode layer 170.

A roughness 180 is formed on the transparent electrode layer 170. The roughness 180 may include sapphire ($Al_2O_3$) such as sapphire powder and deionized (DI) water as a main material.

The roughness 180 may be deposited on the surface of the transparent electrode layer 170 as an uneven, multiply-convex, convex-textured, or random pattern. The roughness 180 may have a random size and shape. The roughness 180 may be formed of irregular interval and a discontinuous pattern. The roughness 180 may be formed of a regular interval.

A first electrode 191 is disposed on the first conductive semiconductor layer 140. The first electrode 191 may be formed of at least one of Ti, Al, In, Ta, Pd, Co, Ni, Si, Ge, Ag, Au and an alloy thereof.

A second electrode 193 is disposed on the second conductive semiconductor layer 160 and/or the transparent electrode layer 170. The second electrode 193 may directly contact the second conductive semiconductor layer 160 and/or the transparent electrode layer 170. The second electrode 193 may be disposed in a certain branched pattern, but is not limited thereto. The second electrode 193 may be formed of at least one of Ag, Ag alloy, Ni, Al, Al alloy, Rh, Pd, Ir, Ru, Mg, Zn, Pt, Au, Hf, and an alloy thereof.

A part of the second electrode 193 may be formed on the roughness 180. The second electrode 193 may directly contact a portion of the roughness 180, but is not limited thereto.

The roughness 180 on the light emitting structure 165 may improve external quantum efficiency. Here, the refractive index of a GaN-based semiconductor layer (for example, second conductive semiconductor layer) is about 2.4. When the transparent electrode layer 170 is formed of, for example, ITO, the refractive index thereof ranges from about 2.1 to about 1.17. The refractive index of the transparent electrode layer 170 ranges from about 1.8 to about 2.1 in a wavelength band from about 400 nm to about 800 nm. The refractive index of the roughness 180 including a sapphire material may be about 1.76. The refractive index is described above as an example, and is not limited thereto.

In an embodiment, the second conductive semiconductor layer 160, the transparent electrode layer 170, and the roughness 180 may be arranged in descending order of their refractive indices. Light emitted from the active layer 150 is emitted to the outside through the second conductive semiconductor layer 160, and the transparent electrode layer 170 and/or the roughness 180. In this case, the critical angle of light transmitting the transparent electrode layer 170 is changed at the interface between the transparent electrode layer 170 and the roughness 180, thereby improving light extraction efficiency. Light may be emitted through the transparent electrode layer 170, or may be diffused by the roughness 180.

The first electrode 191 may be formed in a predetermined shape and pattern, but is not limited thereto. The first electrode 191 may serve as an electrode pad, and may be formed of at least one of Ti, Al, In, Ta, Pd, Co, Ni, Si, Ge, Ag, and an alloy thereof, but is not limited thereto.

FIGS. 2 to 6 are views illustrating a method of manufacturing the semiconductor light emitting device of FIG. 1.

Figure 2:
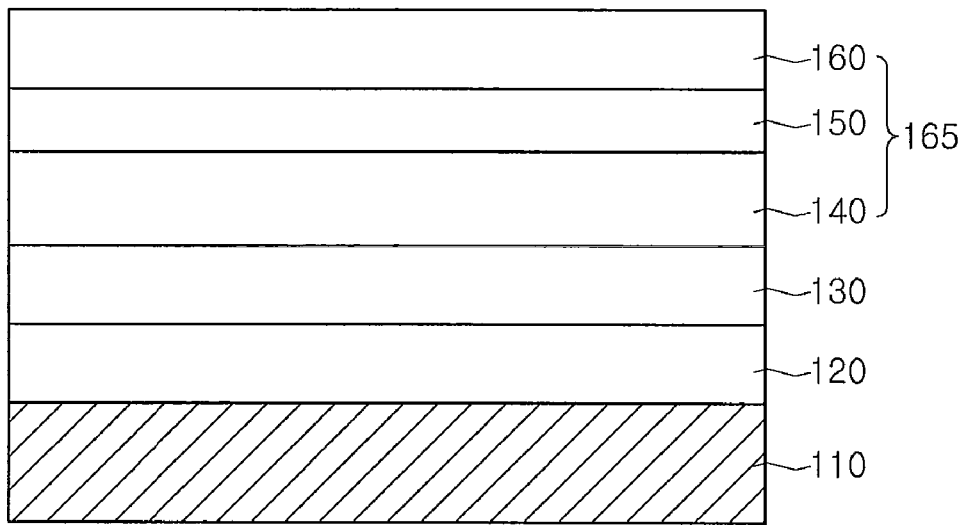
FIGS. 2 to 6 are views illustrating a method of manufacturing the semiconductor light emitting device of FIG. 1.

Referring FIG. 2, a substrate 110 is loaded to growth equipment, and a compound semiconductor layer of group II to VI elements is formed on the substrate 110.

The substrate 110 may be formed of at least one of sapphire ($Al_2O_3$), SiC, Si, GaAs, GaN, ZnO, GaP, InP, and Ge. The substrate 110 may be a substrate having conductive or insulating characteristics.

A nitride semiconductor is grown on the substrate 110. The Growth equipment may include an E-beam evaporator, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus, but is not limited to the equipment.

A buffer layer 120 is formed on the substrate 110. The buffer layer 120 may be formed of at least one of a compound semiconductor of group III-V elements, for example, GaN, InN, AlN, InGaN, AlGaN, InAlGaN, and AlInN. As the buffer layer 120, a compound semiconductor of group II to VI elements, for example, an oxide material such as ZnO may be formed in a layer or multiple patterns.

An undoped semiconductor layer 130 is formed on the buffer layer 120. The undoped semiconductor layer 130 may be formed of an undoped GaN-based semiconductor. The buffer layer 120 and/or the undoped semiconductor layer 130 may not be formed, or may be removed and excluded from the final device.

A light emitting structure 165 including a plurality of compound semiconductor layers may be formed on the buffer layer 120 and/or the undoped semiconductor layer 130. The light emitting structure 165 includes a stacked structure of a first conductive semiconductor layer 140, an active layer 150, and a second conductive semiconductor layer 160 using a compound semiconductor of group III-V elements.

The first conductive semiconductor layer 140 may be selected from compound semiconductors of group III-V elements such as GaN, AlN, AlGaN, InGaN, InN, InAlGaN, AlInN, AlGaAs, GaP, GaAs, GaAsP, and AlGaInP. The first conductive semiconductor layer 140 is doped with a first conductive dopant. When the first conductive semiconductor is an N-type semiconductor, the first conductive dopant includes an N-type dopant such as Si, Ge, Sn, Se, and Te. The first conductive semiconductor layer 140 may be formed in a mono- or multi-layer, but is not limited thereto.

The active layer 150 is formed on the first conductive semiconductor layer 140 in a single or multiple quantum well structure. The active layer 150 may include a cycle of well layer/barrier layer, for example, InGaN/GaN or InGaN/InGaN periodically stacked using a compound semiconductor material of group III-V elements, but is not limited the above cycle. A conductive clad layer may be formed on and/or under the active layer 150. The conductive clad layer may be formed of an AlGaN-based semiconductor.

The second conductive semiconductor layer 160 is formed on the active layer 150. The second conductive semiconductor layer 160 may be selected from the compound semiconductors of group III-V elements doped with a second conductive dopant, which may include, for example, GaN, AlN, AlGaN, InGaN, InN, InAlGaN, AlInN, AlGaAs, GaP, GaAs, GaAsP and AlGaInP. When the second conductive semiconductor is a P-type semiconductor, the second conductive dopant includes a P-type dopant such as Mg, Zn, Ca, Sr, and Ba. The second conductive semiconductor layer 160 may be formed in a mono- or multi-layer, but is not limited thereto.

The light emitting structure 165 may include a third conductive semiconductor layer (not shown), that is, an N-type semiconductor layer or a P-type semiconductor layer on the second conductive semiconductor layer 160. Also, the first conductive semiconductor layer 140 may be implemented in a P-type semiconductor layer, and the second conductive semiconductor layer 160 may be implemented in an N-type semiconductor layer. Thus, the light emitting structure 165 may include at least one of an N—P junction, a P—N junction, an N—P—N junction, and a P—N—P junction structure.

Figure 3:
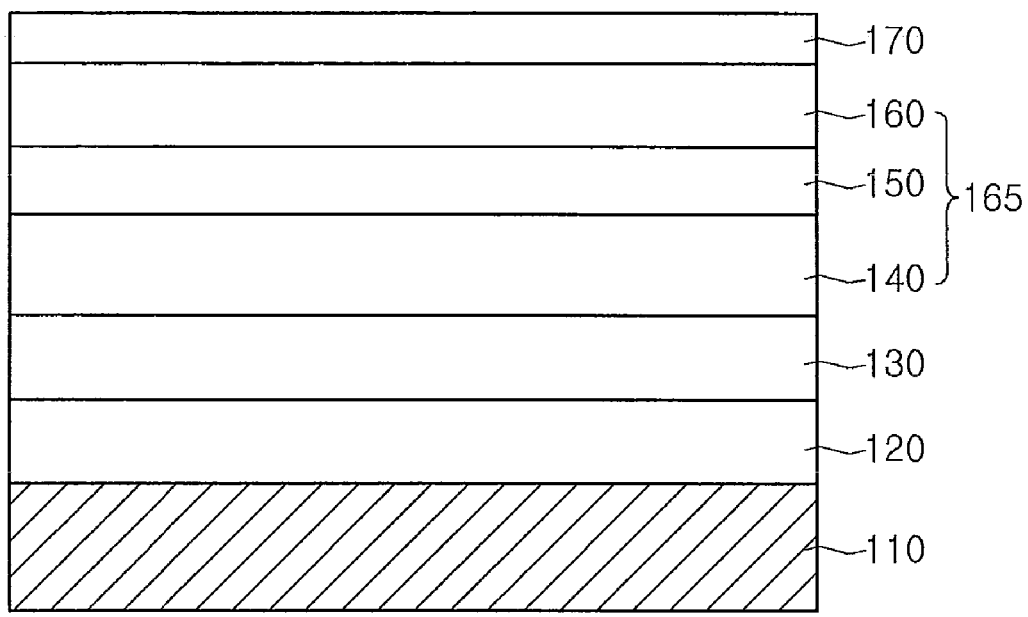

Referring to FIG. 3, a transparent electrode layer 170 may be formed on the second conductive semiconductor layer 160 or the third conductive semiconductor layer. The transparent electrode layer 170 may be selected from materials of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), ZnO, $IrO_x$, $RuO_x$, NiO, Ni/Au, IrOx, RuOx, RuOx/ITO, Ni/IrOx/Au, Ni/IrOx/Au/ITO and other metal oxides.

An ohmic contact layer (not shown) may be formed on the second conductive semiconductor layer 160 in a layer or multiple pattern. The ohmic contact layer may be formed of any of the materials forming the transparent electrode layer 170.

Figure 4:
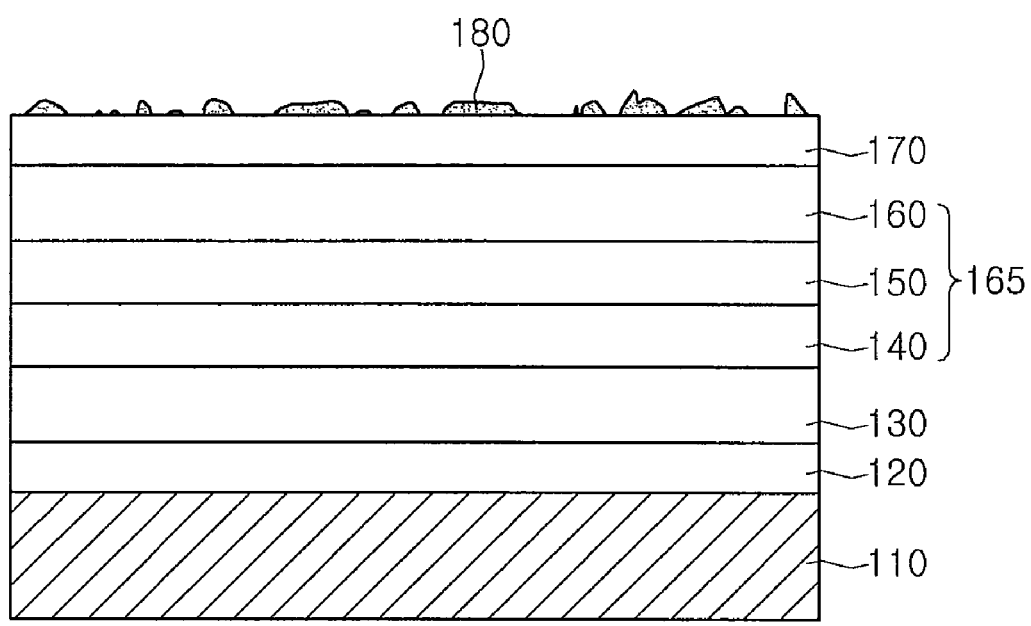

Referring to FIG. 4, a roughness 180 is formed on the transparent electrode layer 170. The roughness 180 may include sapphire ($Al_2O_3$) such as sapphire powder and DI water as a main material.

The roughness 180 may be formed by depositing a solution mixed with the sapphire powder and DI water on the surface of the transparent electrode layer 170 through a spin coating method. After the roughness 180 is deposited on the transparent electrode layer 170, a baking process is performed at a predetermined temperature (for example, from about 500° C. to about 600° C.).

The roughness 180 may be deposited on the surface of the transparent electrode layer 170 in an uneven, multiply-convex, convex-textured, or random pattern. The roughness 180 may have a random size and shape. The roughness 180 may be formed at a regular or irregular interval.

Figure 5:
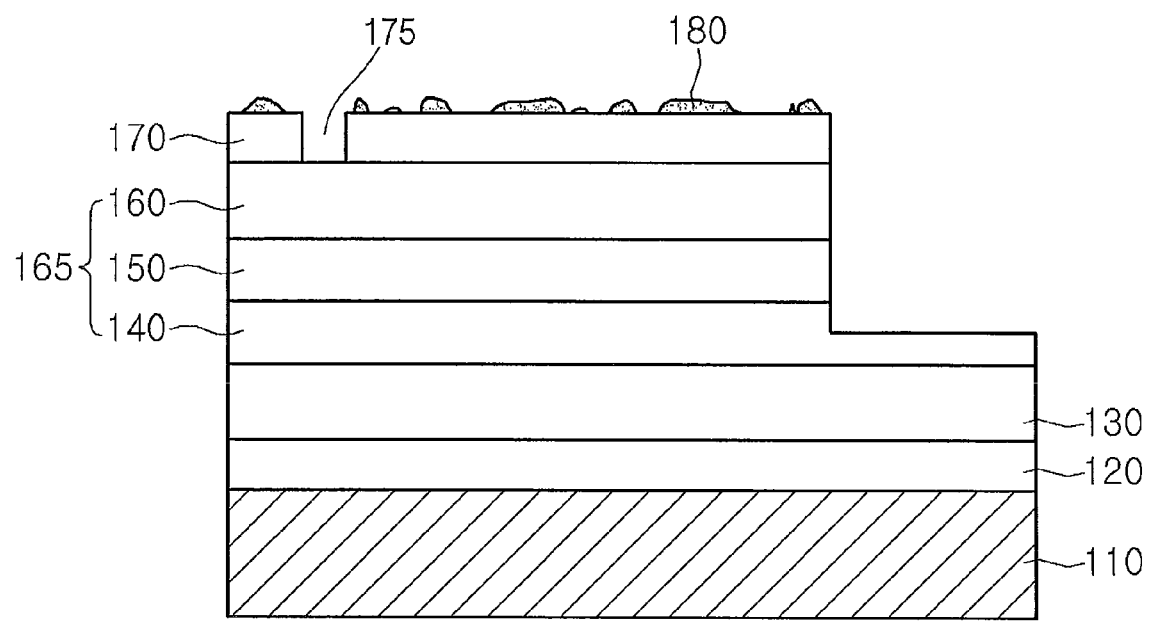

Referring to FIG. 5, if the roughness 180 is formed on the transparent electrode layer 170, a mesa etching is performed to expose a portion of the first conductive semiconductor layer 140.

A second electrode hole 175 may be formed in the transparent electrode layer 170, or may not be formed.

Figure 6:
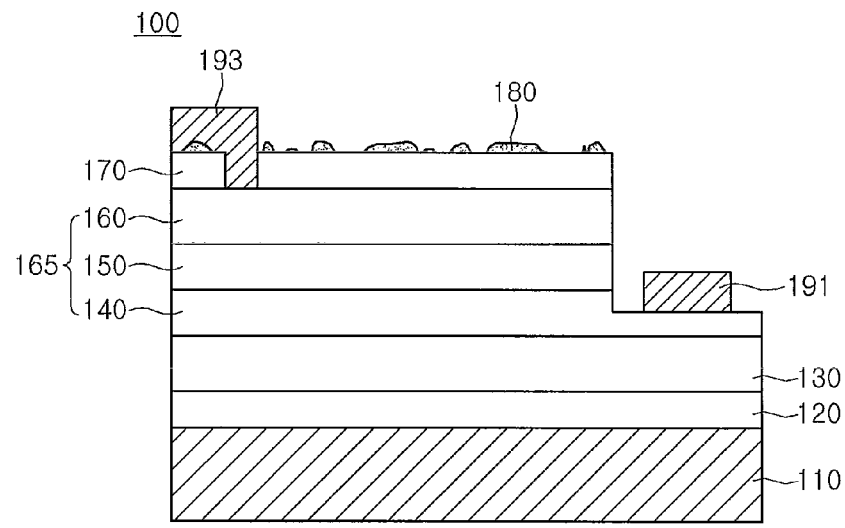

Referring to FIG. 6, a first electrode 191 is formed on the first conductive semiconductor layer 140, and a second electrode 193 is formed on the transparent electrode layer 170 and/or the second conductive semiconductor layer 160. The second electrode 193 may contact the second conductive semiconductor directly or indirectly.

The refractive index of ITO included in the transparent layer 170 ranges from about 2.1 to about 1.17, but ranges from about 1.8 to about 2.1 in a wavelength band from about 400 nm to about 800 nm. The refractive index of the roughness 180 including sapphire may be about 1.76. The refractive index is described above as an example, and is not limited thereto.

The refractive indices of the second conductive semiconductor layer 160, the transparent electrode layer 170, and the roughness 180 are arranged in a descending order to facilitate light emission. Thus, light emitted from the active layer 150 may be emitted to the outside through the second conductive semiconductor layer 160, and the transparent electrode layer 170 and/or the roughness 180. In this case, the critical angle of light transmitting the transparent electrode layer 170 is changed at the interface between the transparent electrode layer 170 and the roughness 180, thereby improving light extraction efficiency. Light may be emitted through the transparent electrode layer 170, or may be diffused by the roughness 180.

Figure 7:
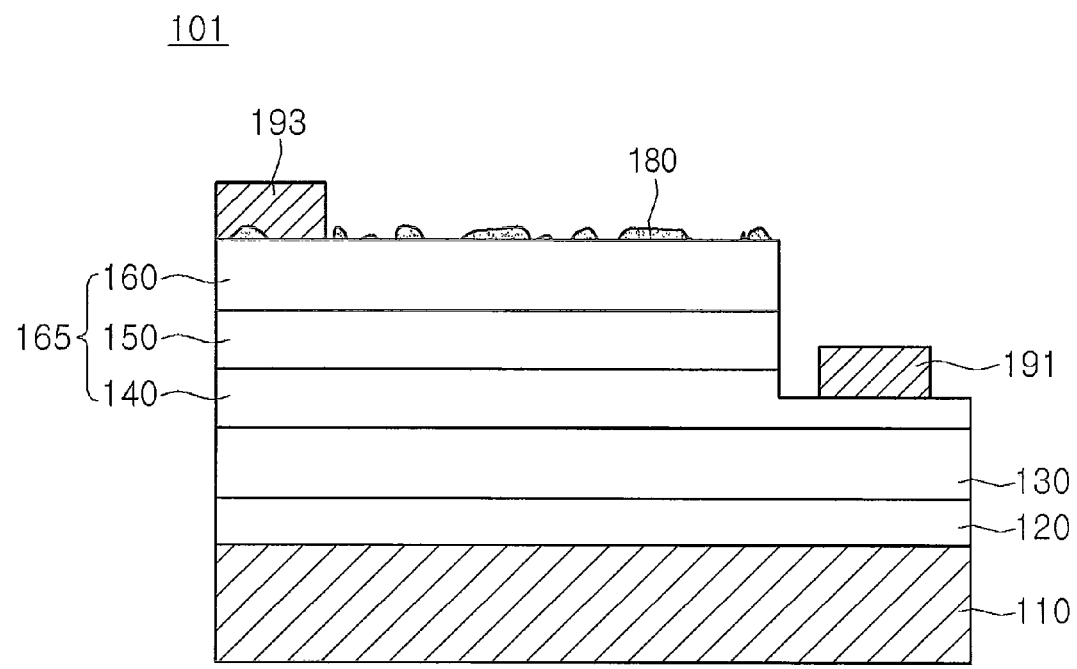
FIG. 7 is a side sectional view illustrating a semiconductor light emitting device according to a second embodiment.

FIG. 7 is a side sectional view illustrating a semiconductor light emitting device according to a second embodiment. To explain the second embodiment, detailed description of parts identical to those of the first embodiment will be omitted by referring to the first embodiment.

Referring to FIG. 7, a semiconductor light emitting device 101 includes a substrate 110, a buffer layer 120, an undoped semiconductor layer 130, a first conductive semiconductor layer 140, an active layer 150, a second conductive semiconductor layer 160, and a roughness 180.

The roughness 180 is disposed on the second conductive semiconductor layer 160. The roughness is formed by depositing a mixed solution of a certain ratio of sapphire powder and DI water on the surface of the second conductive semiconductor layer 160 through a spin coating method. Then, the roughness 180 is processed at a predetermined temperature (for example, from about 500° C. to about 600° C.) through a baking process.

The roughness 180 may be deposited on the surface of the transparent electrode layer 170 as an uneven, multiply-convex, convex-textured, or random pattern. The roughness 180 may have a random size and shape. The roughness 180 may be formed at a regular or irregular interval.

Hereinafter, description of a method for forming the roughness 180 will refer to the first embodiment.

Here, an N-type semiconductor (not shown) may be formed as a third conductive semiconductor layer on the second conductive semiconductor layer 160. In this case, the roughness 180 may be formed on the third conductive semiconductor layer.

Since the refractive index of the GaN-based semiconductor layer (for example, second conductive semiconductor layer) is about 2.4, and the refractive index of the roughness including a sapphire material is about 1.76, light may easily be emitted by a difference between the refractive indices of the second conductive semiconductor layer 160 and the roughness 180. That is, light emitted from the active layer 150 may be emitted through the second conductive semiconductor layer 160 and/or the roughness 180. The critical angle of light is changed at the interface between the second conductive semiconductor layer 160 and the roughness 180, thereby improving light extraction efficiency.

The semiconductor light emitting device 101 can reduce its total internal reflection ratio and increase its extraction efficiency by forming the roughness 180 on the light emitting structure 165 using a sapphire material.

Figure 8:
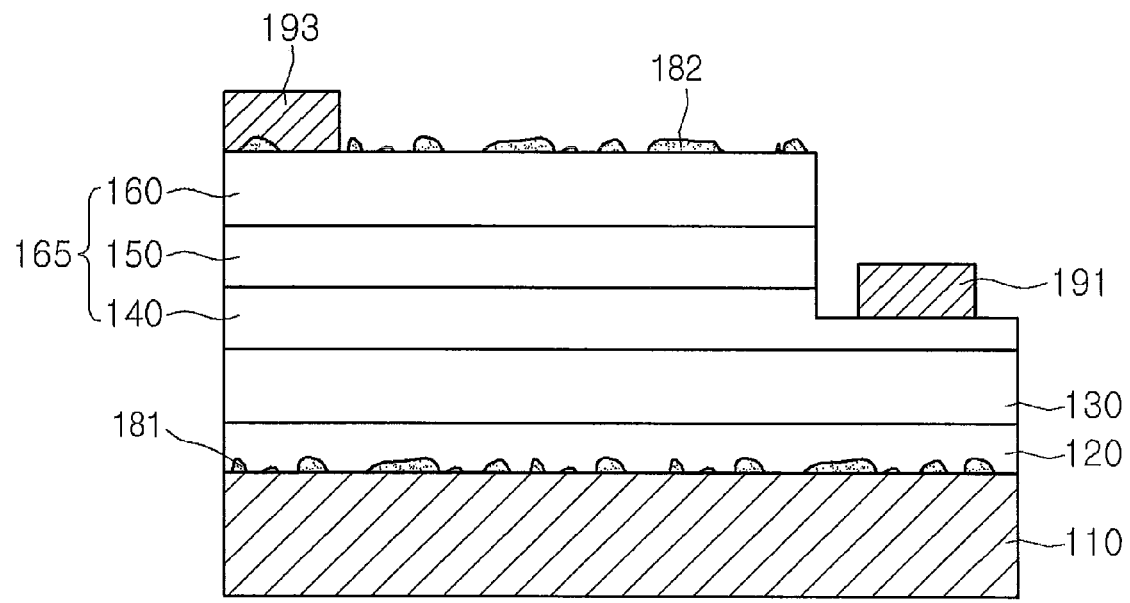
FIG. 8 is a side sectional view illustrating a semiconductor light emitting device according to a third embodiment.

FIG. 8 is a side sectional view illustrating a semiconductor light emitting device according to a third embodiment. To explain the third embodiment, detailed description of parts identical to those of the first embodiment will be omitted by referring to the first embodiment.

Referring to FIG. 8, a semiconductor light emitting device 102 includes a substrate 110, a first roughness 181, a buffer layer 120, an undoped semiconductor layer 130, a first conductive semiconductor layer 140, an active layer 150, a second conductive semiconductor layer 160, and a second roughness 182.

The first roughness 181 may be formed by depositing a mixed solution of sapphire power and DI water on the substrate 110 through a spin coating method and performing a baking process at a predetermined temperature. Description of a method for forming the first roughness 181 will refer to the first embodiment.

The first roughness 181 may be deposited on the substrate 110 as an uneven, multiply-convex, convex-textured, or random pattern. The first roughness 181 may have a random size and shape. The roughness 181 and 182 may be formed at a regular or irregular interval.

The second roughness 182 is formed on the second conductive semiconductor layer 160. The second roughness 182 may be formed on the second conductive semiconductor layer 160 using a sapphire material. Description of a method of forming the second roughness 182 will refer to the first embodiment.

The second roughness 182 may be formed on at least one of the substrate 110, the buffer layer 120, and the undoped semiconductor layer 130, but is not limited thereto. Also, the second roughness 182 may be formed of a different material from the sapphire material, and may be varied within the technical scope of the embodiment.

A third conductive semiconductor layer (not shown) and/or a transparent electrode layer (not shown) may be disposed on the second conductive semiconductor layer 160. In this case, the second roughness 182 may be disposed on the third conductive semiconductor layer or the transparent electrode layer. The second roughness 182 may be disposed on the light emitting structure 165.

In the semiconductor light emitting device 102, the first roughness 181 and the second roughness 182 on/under the light emitting structure 165 may change the critical angle of light, or may diffuse light, thereby improving external quantum efficiency.

Figure 9:
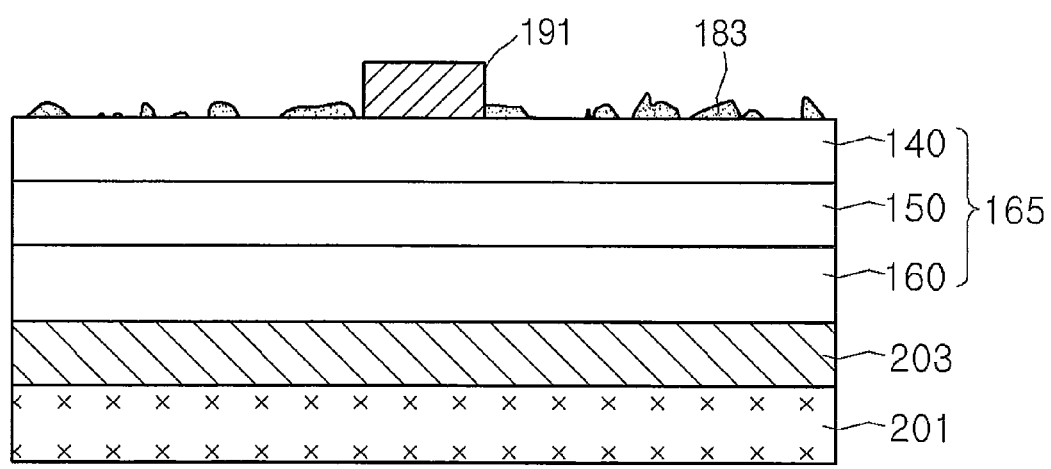
FIG. 9 is a side sectional view illustrating a semiconductor light emitting device according to a fourth embodiment.

FIG. 9 is a side sectional view illustrating a semiconductor light emitting device according to a fourth embodiment. To explain the fourth embodiment, detailed description of parts identical to those of the first embodiment will be omitted by referring to the first embodiment.

Referring to FIG. 9, a semiconductor light emitting device 103 includes a light emitting structure 165, a roughness 183, a first electrode 191, a second electrode layer 203, and a conductive support member 201.

The second electrode layer 203 may be formed under a second conductive semiconductor layer 160 of the light emitting structure 165, and may perform a reflection electrode function.

The second electrode layer 203 may be formed on the second conductive semiconductor layer 160 of FIG. 3, or may be disposed on the roughness 180 and the second conductive semiconductor layer 160 of FIG. 4.

A layer or a plurality of patterns is formed between the second conductive semiconductor layer 130 and the electrode layer 150, wherein the layer or the plurality of patterns includes at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, and RuOx.

The second electrode layer 203 may serve as at least one of a reflective electrode layer, an ohmic-contact layer, and an adhesion layer. The second electrode layer 203 may include at least one of metallic material and oxide material. The reflective electrode layer may includes at least one of Ag, Ag alloy, Ni, Al, Al alloy, Rh, Pd, Ir, Ru, Mg, Zn, Pt, Au, Hf, and an alloy thereof, but is not limited thereto. The ohmic-contact layer may include at least one at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO, Pt, Ni, Au, Rh and Pd. The adhesion layer may include at least one of Ti, Au, Sn, Ni, Cr, Ga, In, Bi, Cu, Ag, and Ta. The second electrode layer 203 may comprises a seed metal.

An ohmic contact layer (not shown) may be disposed between the second electrode layer 203 and the second conductive semiconductor layer 160. The ohmic contact layer may be formed in a layer or multiple patterns. The ohmic contact layer may include at least one of Ni, Pd, Pt, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO. The first electrode 191 may be formed on a roughness 183 and/or the first conductive semiconductor layer 140. The conductive support member 201 may be formed under the second electrode layer 203. The conductive support member 201 may be formed through a plating process, and may be implemented using Cu, Au, Ni, Mo, Cu—W, a carrier wafer such as Si, Ge, GaAs, ZnO, SiGe, GaN and SiC. The conductive support member 201 may be formed through an electro-plating, or in a sheet shape, but is not limited thereto. The thickness of the conductive support member 201 ranges from about 30 μm to about 150 μm, but is not limited thereto. The conductive support member 201 performs a base substrate function of a chip.

The conductive support member 201 and the second electrode layer 203 may be formed into one layer having a certain thickness, but is not limited thereto.

Here, if the second electrode layer 203 and the conductive support member 201 are formed on the light emitting structure 165, the conductive support member 201 is positioned at the base. The substrate 110 of FIG. 2 may be removed through physical and/or chemical methods. In the case of the physical removal method, a laser having a certain range of wavelength is irradiated on the substrate (110 in FIG. 2) to separate the substrate (110 in FIG. 2) by Laser Lift Off (LLO) process. In the case of the chemical removal method, the substrate may be separated by removing other semiconductor layers (for example, buffer layer) between the substrate and the first conductive semiconductor layer 140 using a wet etchant. The undoped semiconductor layer (130 in FIG. 2) may be removed by an etching, or be removed together with the buffer layer.

The polishing process by Inductively Coupled Plasma/Reactive Ion Etching (ICP/RIE) may be performed on the surface of the first conductive semiconductor layer 140 from which the substrate (110 in FIG. 2) is removed.

A first electrode 191 and a roughness 183 may be formed on the first conductive semiconductor layer 140. The roughness 183 may be formed of a sapphire material. The roughness 183 may be formed on the first conductive semiconductor layer 140 in a roughness pattern using a mixed solution of sapphire powder and DI water. Descriptions of the method of forming the first roughness and its shape will refer to the first embodiment.

The first electrode 191 may be formed on the top surface of the first conductive semiconductor layer 140 in a certain pattern, and may include a current spreading structure.

The roughness pattern may be formed by etching the top surface of the first conductive semiconductor layer 140 in an uneven pattern, but is not limited thereto.

In an embodiment, a mesa etching may be performed after/before the first electrode is formed. After the mesa etching, a breaking process is performed by chip unit.

In the fourth embodiment, a roughness, for example, including a sapphire material may be formed between the second electrode layer 203 and the second conductive semiconductor layer 160. The roughness may be formed by depositing a mixed solution of sapphire powder and DI water on the second conductive semiconductor layer 160 through a spin coating method (refer to FIG. 4). Detailed description thereof will refer to the first embodiment.

Figure 10:
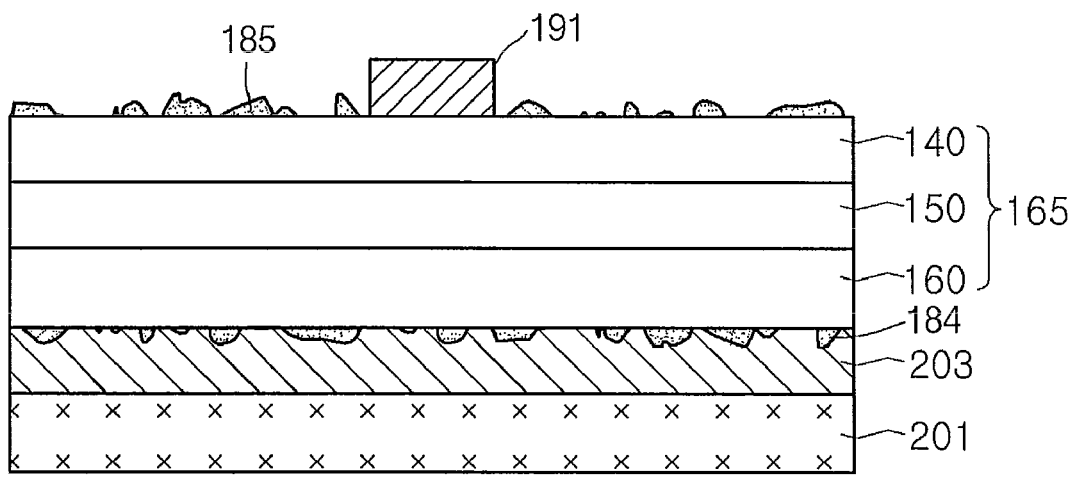
FIG. 10 is a side sectional view illustrating a semiconductor light emitting device according to a fifth embodiment.

FIG. 10 is a side sectional view illustrating a semiconductor light emitting device according to a fifth embodiment. To explain the fifth embodiment, detailed description of parts identical to those of the fourth embodiment will be omitted by referring to the first embodiment.

Referring to FIG. 10, a semiconductor light emitting device 104 includes a light emitting structure 165, a first roughness 184, a second roughness 185, a first electrode 191, a second electrode layer 203, and a conductive support member 201.

The first roughness 184 is formed between the light emitting structure 165 and the second electrode layer 203. The second roughness 185 is formed on the first conductive semiconductor layer 140. The first and second roughness 184 and 185 may be formed of a sapphire material. The first and second roughness 184 and 185 may be formed with a roughness pattern using a mixed solution of sapphire powder and DI water. Descriptions of the method of forming the first roughness and its shape will refer to the first embodiment.

The first electrode 191 may be formed on the top surface of the first conductive semiconductor layer 140 in a certain pattern, and may include a current spreading structure.

The features of the embodiments may be selectively applied to another embodiment without being limited to each embodiment. These embodiments can improve luminous efficiency of a semiconductor light emitting device such as an LED.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
   a substrate;
   a plurality of compound semiconductor layers on the substrate,
   wherein the plurality of compound semiconductor layers comprises
   a first conductive semiconductor layer,
   an active layer on the first conductive semiconductor layer, and
   a second conductive semiconductor layer on the active layer;
   a first electrode electrically connected to the first conductive semiconductor layer;

a transparent electrode layer on the second conductive semiconductor layer;

a second electrode electrically connected directly to the second conductive semiconductor layer through an opening of the transparent electrode layer; and a first roughness comprising a sapphire material on the transparent electrode layer.

2. The semiconductor light emitting device according to claim 1, further comprising:

a buffer layer and/or an undoped semiconductor layer using a compound semiconductor of group II to VI elements between the substrate and the first conductive semiconductor layer.

3. The semiconductor light emitting device according to claim 2, further comprising a second roughness comprising a sapphire material formed on at least one of the substrate, the buffer layer, and the undoped semiconductor layer.

4. The semiconductor light emitting device according to claim 1, wherein a refractive index of the first roughness is small than a refractive index of the transparent electrode layer.

5. The semiconductor light emitting device according to claim 1, wherein the first roughness is formed of an irregular interval and a discontinuous pattern.

6. A semiconductor light emitting device, comprising:

a first conductive semiconductor layer;

a transparent electrode layer on the first conductive semiconductor layer;

a first electrode on the first conductive semiconductor layer, the first electrode directly connecting to the first conductive semiconductor layer through an opening of the transparent electrode layer;

an active layer under the first conductive semiconductor layer;

a second conductive semiconductor layer under the active layer;

a second electrode layer under a second conductive semiconductor; and a first roughness comprising a sapphire material between second electrode layer and the second conductive semiconductor.

7. The semiconductor light emitting device according to claim 6, further comprising:

a second roughness formed on the first conductive semiconductor layer and formed of a sapphire material.

8. The semiconductor light emitting device according to claim 6, wherein the first conductive semiconductor layer comprises an N-type semiconductor layer using group III-V elements, and the second conductive semiconductor layer comprises a P-type semiconductor layer using group III-V elements.

9. The semiconductor light emitting device according to claim 6, further comprising;

a conductive supporting member formed under the second electrode layer, wherein the second electrode layer comprises at least one of ITO(indium tin oxide), IZO(indium zinc oxide), IZTO(indium zinc tin oxide), IAZO(indium aluminum zinc oxide), IGZO(indium gallium zinc oxide), IGTO (indium gallium tin oxide), AZO(aluminum zinc oxide), ATO(antimony tin oxide), GZO(gallium zinc oxide), IrOx, RuOx, RuOx/ITO, Ni/IrOx/Au, Ni/IrOx/Au/ITO, Pt, Rh, Pd, Ti, Au, Sn, Ni, Cr, Ga, In, Bi, Cu, Ag, and Ta.

* * * * *